United States Patent
Su et al.

(10) Patent No.: US 10,164,156 B2
(45) Date of Patent: Dec. 25, 2018

(54) STRUCTURE AND FORMATION METHOD OF IMAGE SENSOR STRUCTURE WITH GRID STRUCTURE

(71) Applicant: Taiwan Semiconductor Manufacturing Co., Ltd., Hsinchu (TW)

(72) Inventors: Ching-Chung Su, Tainan (TW); Hung-Wen Hsu, Tainan (TW); Wei-Chuang Wu, Tainan (TW); Wei-Lin Chen, Hsinchu (TW); Jiech-Fun Lu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/476,370

(22) Filed: Mar. 31, 2017

(65) Prior Publication Data
US 2018/0286907 A1 Oct. 4, 2018

(51) Int. Cl.
| H01L 31/0232 | (2014.01) |
|---|---|
| H01L 21/00 | (2006.01) |
| H01L 33/46 | (2010.01) |
| H01L 27/146 | (2006.01) |
| H01L 31/056 | (2014.01) |
| H01L 27/148 | (2006.01) |

(52) U.S. Cl.
CPC ........ *H01L 33/46* (2013.01); *H01L 27/14629* (2013.01); *H01L 27/14643* (2013.01); *H01L 27/14868* (2013.01); *H01L 31/056* (2014.12)

(58) Field of Classification Search
CPC ................. H01L 27/14629; H01L 27/14868
USPC .................. 438/72–78; 257/435–437
See application file for complete search history.

(56) References Cited

U.S. PATENT DOCUMENTS

| 7,470,965 | B2 * | 12/2008 | Kuriyama | ......... H01L 27/14621 |
| | | | | 257/443 |
| 8,053,855 | B2 * | 11/2011 | Nam | ................. H01L 27/14623 |
| | | | | 257/225 |
| 8,237,834 | B2 * | 8/2012 | Inuiya | ............... H01L 27/14623 |
| | | | | 257/291 |
| 9,111,829 | B2 * | 8/2015 | Tay | ................... H01L 27/14603 |
| 9,658,109 | B2 * | 5/2017 | Geiger | .................... G01J 5/046 |
| 9,726,784 | B2 * | 8/2017 | Tsubouchi | ............. G02B 5/208 |
| 9,966,370 | B2 * | 5/2018 | Moosburger | ............ H01L 25/50 |
| 9,976,706 | B2 * | 5/2018 | Schwalenberg | .......... F21K 9/61 |
| 2009/0085137 | A1 * | 4/2009 | Kuriyama | ......... H01L 27/14621 |
| | | | | 257/432 |

(Continued)

*Primary Examiner* — Calvin Lee
(74) *Attorney, Agent, or Firm* — Birch, Stewart, Kolasch & Birch, LLP (57) ABSTRACT

Structures and formation methods of an image sensor structure are provided. The image sensor structure is provided. The image sensor structure includes a substrate, a photodiode component in the substrate, and a grid structure over the substrate. The grid structure includes a bottom dielectric element over the substrate, a reflective element over the bottom dielectric element, and an upper dielectric element over the reflective element. The reflective element has a sidewall which is anti-corrosive in a basic condition and an acidic condition. The image sensor structure also includes a color filter element over the substrate and surrounded by the grid structure. The color filter element is aligned with the photodiode component.

18 Claims, 9 Drawing Sheets

(56) References Cited

U.S. PATENT DOCUMENTS

| | | | |
|---|---|---|---|
| 2012/0306819 A1* | 12/2012 | Yamazaki | G09G 3/344 |
| | | | 345/175 |
| 2015/0097111 A1* | 4/2015 | Hopp | G01D 5/34707 |
| | | | 250/231.13 |
| 2015/0109775 A1* | 4/2015 | Schwalenberg | F21V 23/0457 |
| | | | 362/231 |
| 2015/0253194 A1* | 9/2015 | Van Buggenhout | G01J 5/045 |
| | | | 250/353 |
| 2017/0123317 A1* | 5/2017 | Kamura | G03F 7/039 |
| 2017/0371087 A1* | 12/2017 | You | G02B 6/0021 |

* cited by examiner

STRUCTURE AND FORMATION METHOD OF IMAGE SENSOR STRUCTURE WITH GRID STRUCTURE

BACKGROUND

Image sensors are semiconductor devices capable of converting electric signals into optical images. Image sensors are classified according to their various types, which include the charge coupled device (CCD) type and the complementary metal oxide semiconductor (CMOS) type. A CMOS image sensor (CIS) includes pixels arranged in two dimensions. Each of the pixels includes a photodiode (PD) component, which converts incident light into an electric signal.

As semiconductor devices become more highly integrated, image sensors become highly integrated. Accordingly, the corresponding pixels are scaled down, and the resolution becomes better.

However, existing image sensors have not been satisfactory in every respect. Therefore, it is a challenge to form a reliable image sensor.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the performance of a first process before a second process in the description that follows may include embodiments in which the second process is performed immediately after the first process, and may also include embodiments in which additional processes may be performed between the first and second processes. Various features may be arbitrarily drawn at different scales for the sake of simplicity and clarity. Moreover, the formation of a first feature over or on a second feature in the description that follows may include embodiments in which the first and second features are formed in direct contact, and may also include embodiments in which additional features may be formed between the first and second features, such that the first and second features may not be in direct contact. In some embodiments, the present disclosure may repeat reference numerals and/or letters in some various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the image sensor structure. Some of the features described below can be replaced or eliminated for different embodiments. Although some embodiments are discussed with operations performed in a particular order, these operations may be performed in another logical order.

Figure 1A:
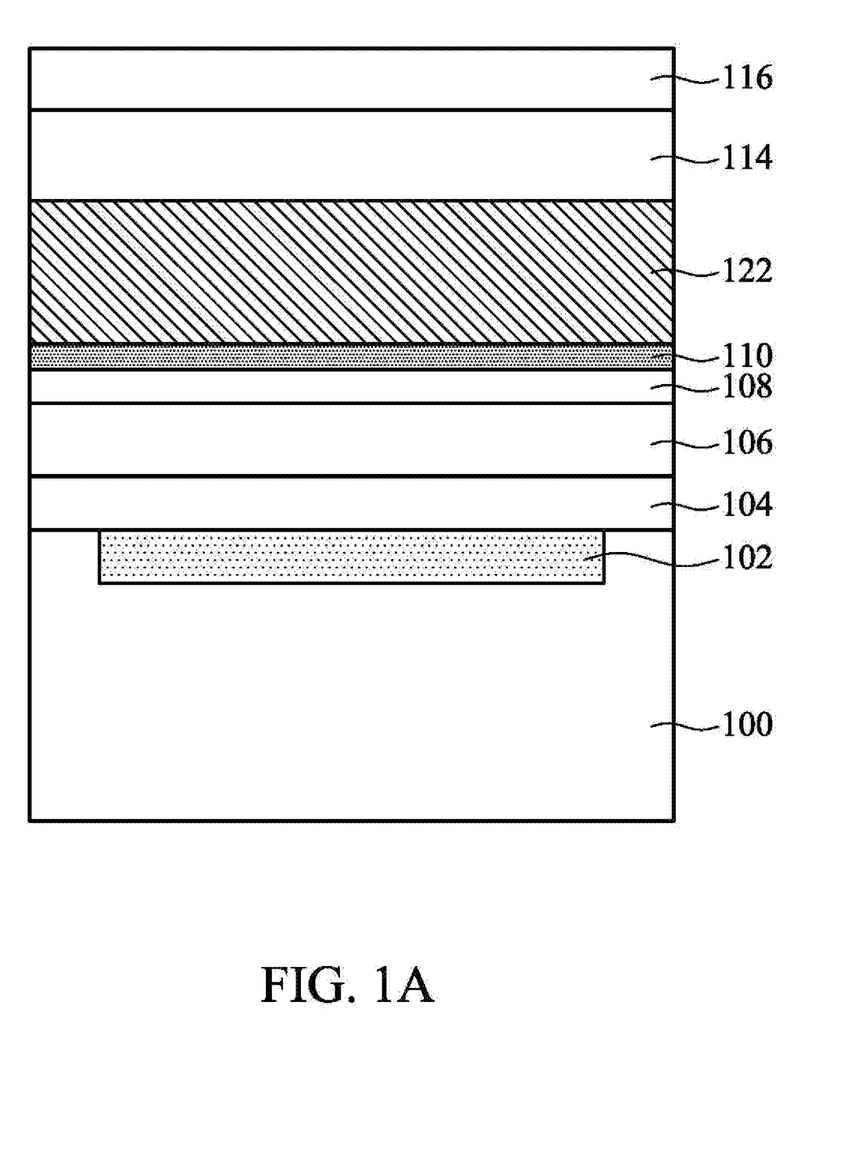
FIGS. 1A-1D are cross-sectional views of various stages of a process for forming an image sensor structure, in accordance with some embodiments.

FIGS. 1A-1D are cross-sectional views of various stages of a process for forming an image sensor structure, in accordance with some embodiments. FIGS. 2A-2B are top views of various stages of a process for forming an image sensor structure, in accordance with some embodiments. As shown in FIG. 1A, a semiconductor substrate 100 is received or provided, in accordance with some embodiments. In some embodiments, the semiconductor substrate 100 is a bulk semiconductor substrate, such as a semiconductor wafer. For example, the semiconductor substrate 100 is a silicon wafer. The semiconductor substrate 100 may include silicon or another elementary semiconductor material such as germanium. In some other embodiments, the semiconductor substrate 100 includes a compound semiconductor. The compound semiconductor may include gallium arsenide, silicon carbide, indium arsenide, indium phosphide, another suitable material, or a combination thereof.

In some embodiments, the semiconductor substrate 100 includes a semiconductor-on-insulator (SOI) substrate. The SOI substrate may be fabricated using a separation by implantation of oxygen (SIMOX) process, a wafer bonding process, another applicable method, or a combination thereof.

As shown in FIG. 1A, a photodiode component 102 is formed in the semiconductor substrate 100, in accordance with some embodiments. In some embodiments, the photodiode component 102 is formed by ion implantation. In some embodiments, the photodiode component 102 is an N-type doped region, and the predetermined region for the photodiode component 102 is implanted with phosphorous ions or arsenic ions to form the photodiode component 102. In some other embodiments, the photodiode component 102 is a P-type doped region, and the predetermined region for the photodiode component 102 is implanted with boron ion, indium ion or boron difluoride ion ($BF_2^+$) to form the photodiode component 102.

Afterwards, as shown in FIG. 1A, an anti-reflection coating 104 is deposited over the semiconductor substrate 100 and the photodiode component 102, in accordance with some embodiments.

In some embodiments, the anti-reflection coating 104 is a single layer or multiple layers of a high dielectric constant material (high-k material). The high-k material includes LaO, AlO, ZrO, TiO, $Ta_2O_5$, $Y_2O_3$, $SrTiO_3$(STO), $BaTiO_3$ (BTO), BaZrO, $HfO_2$, $HfO_3$, HfZrO, HfLaO, HfSiO, HfSiON, LaSiO, AlSiO, HfTaO, HfTiO, HfTaTiO, HfAlON, (Ba,Sr)$TiO_3$(BST), $Al_2O_3$, other suitable high-k dielectric materials, or a combination thereof. The high-k material may further include metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina ($HfO_2$—$Al_2O_3$) alloy, other suitable materials, or a combination thereof.

In some embodiments, the anti-reflection coating 104 is deposited by chemical vapor deposition or spin-on coating. The chemical vapor deposition includes, but is not limited to, low pressure chemical vapor deposition (LPCVD), low temperature chemical vapor deposition (LTCVD), rapid thermal chemical vapor deposition (RTCVD), plasma enhanced chemical vapor deposition (PECVD), atomic layer deposition (ALD), and other applicable methods.

Afterwards, as shown in FIG. 1A, a first dielectric film 106 is deposited over the anti-reflection coating 104, in accordance with some embodiments. In some embodiments, the first dielectric film 106 is made of silicon dioxide, silicon nitride, silicon oxynitride, another suitable material, or a combination thereof. In some embodiments, the first dielectric film 106 is made of silicon dioxide. In some embodiments, the first dielectric film 106 is deposited by the previously described chemical vapor deposition (CVD), spin-on coating, or by another applicable method.

Afterwards, as shown in FIG. 1A, a first dielectric material layer 108 is deposited over the first dielectric film 106, in accordance with some embodiments. In some embodiments, first dielectric material layer 108 is made of silicon nitride, silicon dioxide, silicon oxynitride, another suitable material, or a combination thereof. In some embodiments, first dielectric material layer 108 is made of silicon nitride. In some embodiments, first dielectric material layer 108 is deposited by the previously described chemical vapor deposition (CVD), spin-on coating, or by another applicable method.

In some embodiments, the material of the first dielectric material layer 108 is different from the material of the first dielectric film 106. In some other embodiments, the material of the first dielectric material layer 108 is the same as the material of the first dielectric film 106.

As shown in FIG. 1A, the first dielectric material layer 108 is thinner than the first dielectric film 106, in accordance with some embodiments. However, the embodiments of the present disclosure are not limited thereto. In some other embodiments, the first dielectric material layer 108 is thicker than the first dielectric film 106.

Afterwards, as shown in FIG. 1A, a glue layer 110 is deposited over the first dielectric material layer 108, in accordance with some embodiments. In some embodiments, the glue layer 110 is made of titanium nitride. In some embodiments, the glue layer 110 is deposited by the previously described chemical vapor deposition (CVD), sputtering, resistive thermal evaporation, electron beam evaporation, or by another applicable method.

Afterwards, as shown in FIG. 1A, a reflective material layer 112 is deposited over the glue layer 110, in accordance with some embodiments. As shown in FIG. 1A, the reflective material layer 112 is positioned over the first dielectric material layer 108 and/or the first dielectric film 106, in accordance with some embodiments.

In some embodiments, the reflective material layer 112 is made of titanium. In some embodiments, the reflective material layer 112 is made of an organic material which is anti-corrosive in a basic condition and an acidic condition. In some embodiments, when the reflective material layer 112 is made of titanium, the reflective material layer 112 is also referred to as a titanium-based layer 112 or a titanium layer 112.

In some embodiments, the reflective material layer 112 is deposited by the previously described chemical vapor deposition (CVD), spin-on coating, sputtering, resistive thermal evaporation, electron beam evaporation, or by another applicable method.

Afterwards, as shown in FIG. 1A, a second dielectric material layer 114 is deposited over the reflective material layer 112, in accordance with some embodiments. In some embodiments, second dielectric material layer 114 is made of silicon dioxide, silicon nitride, silicon oxynitride, another suitable material, or a combination thereof. In some embodiments, second dielectric material layer 114 is made of silicon dioxide. In some embodiments, second dielectric material layer 114 is deposited by the previously described chemical vapor deposition (CVD), spin-on coating, or by another applicable method.

In some embodiments, the material of the second dielectric material layer 114 is the same as the material of the first dielectric film 106. In some other embodiments, the material of the second dielectric material layer 114 is different from the material of the first dielectric film 106.

Afterwards, as shown in FIG. 1A, a third dielectric material layer 116 is deposited over the second dielectric material layer 114, in accordance with some embodiments. In some embodiments, third dielectric material layer 116 is made of silicon oxynitride, silicon dioxide, silicon nitride, another suitable material, or a combination thereof. In some embodiments, third dielectric material layer 116 is made of silicon oxynitride. In some embodiments, third dielectric material layer 116 is deposited by the previously described chemical vapor deposition (CVD), spin-on coating, or by another applicable method.

In some embodiments, the material of the third dielectric material layer 116 is different from the material of the second dielectric material layer 114. In some other embodiments, the material of the third dielectric material layer 116 is the same as the material of the second dielectric material layer 114.

Figure 1B:
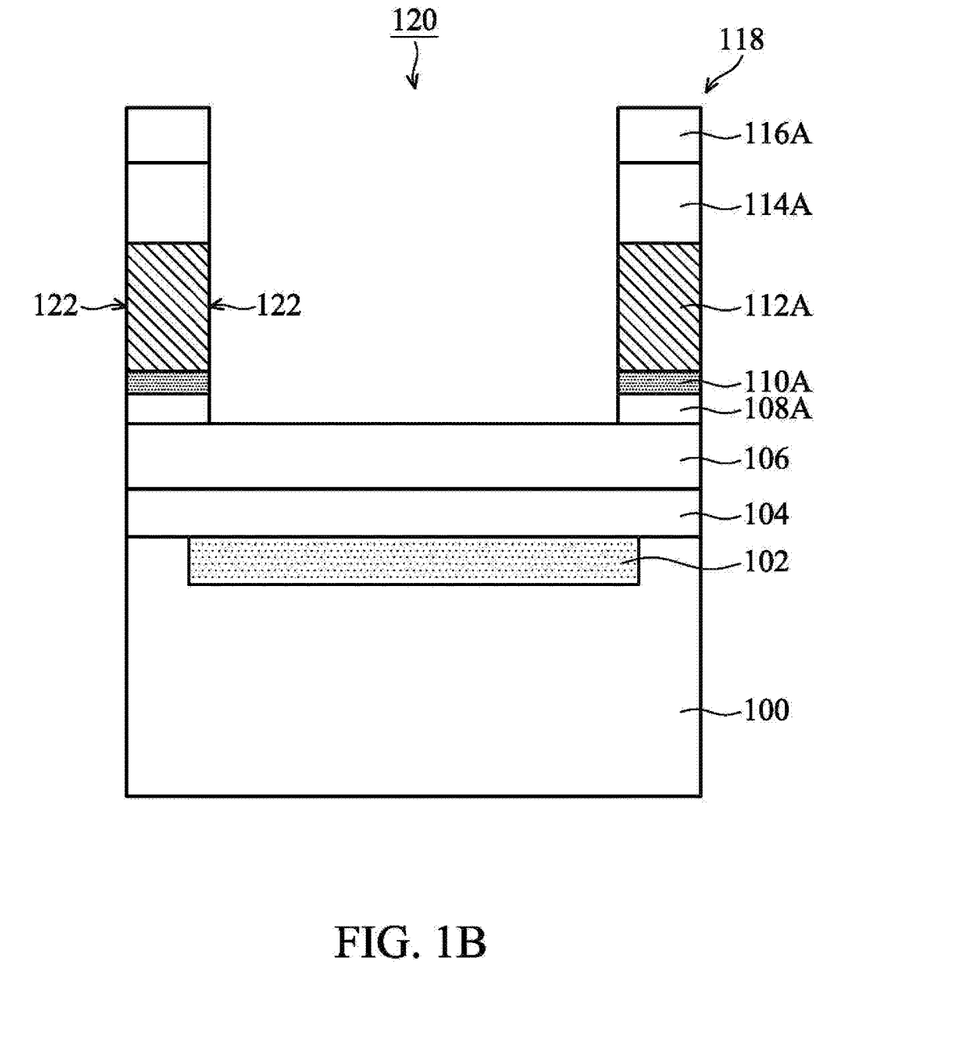
Figure 2A:
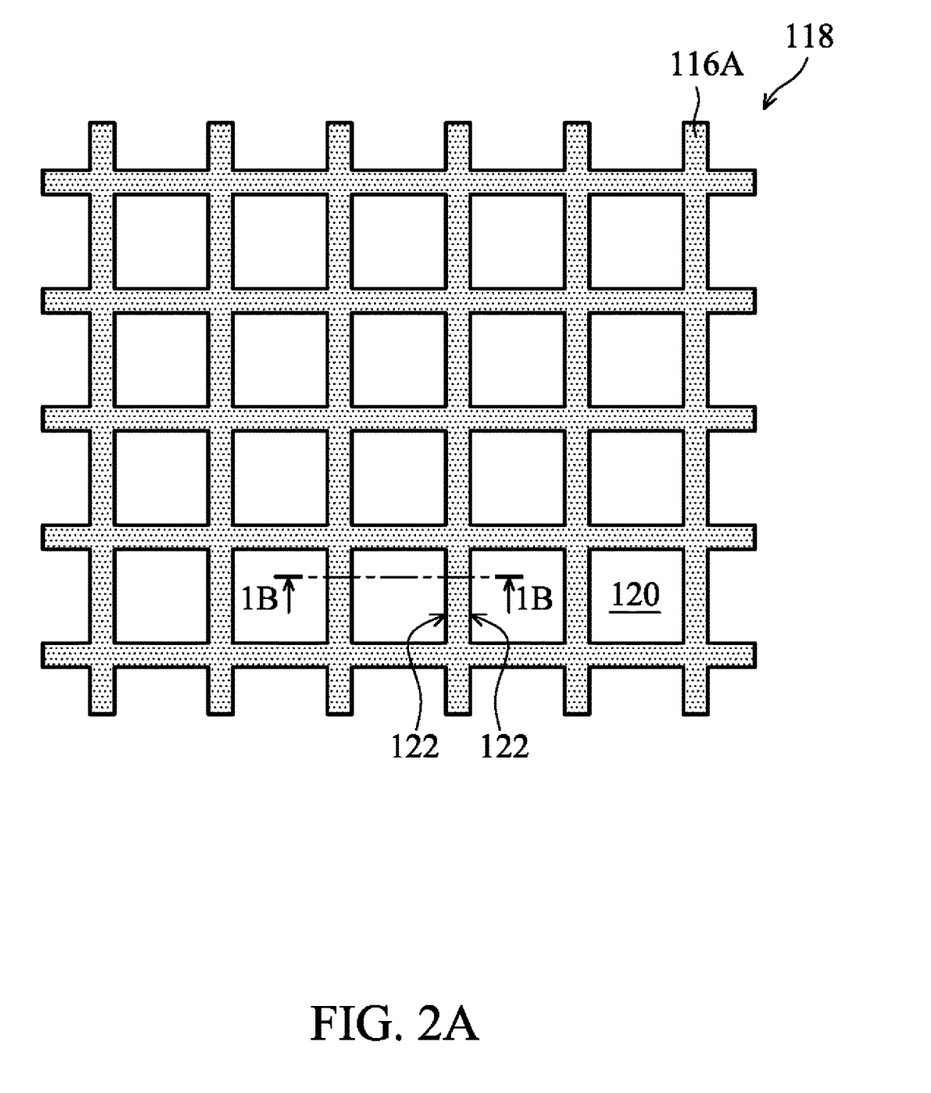
FIGS. 2A-2B are top views of various stages of a process for forming an image sensor structure, in accordance with some embodiments.
Figure 2B:
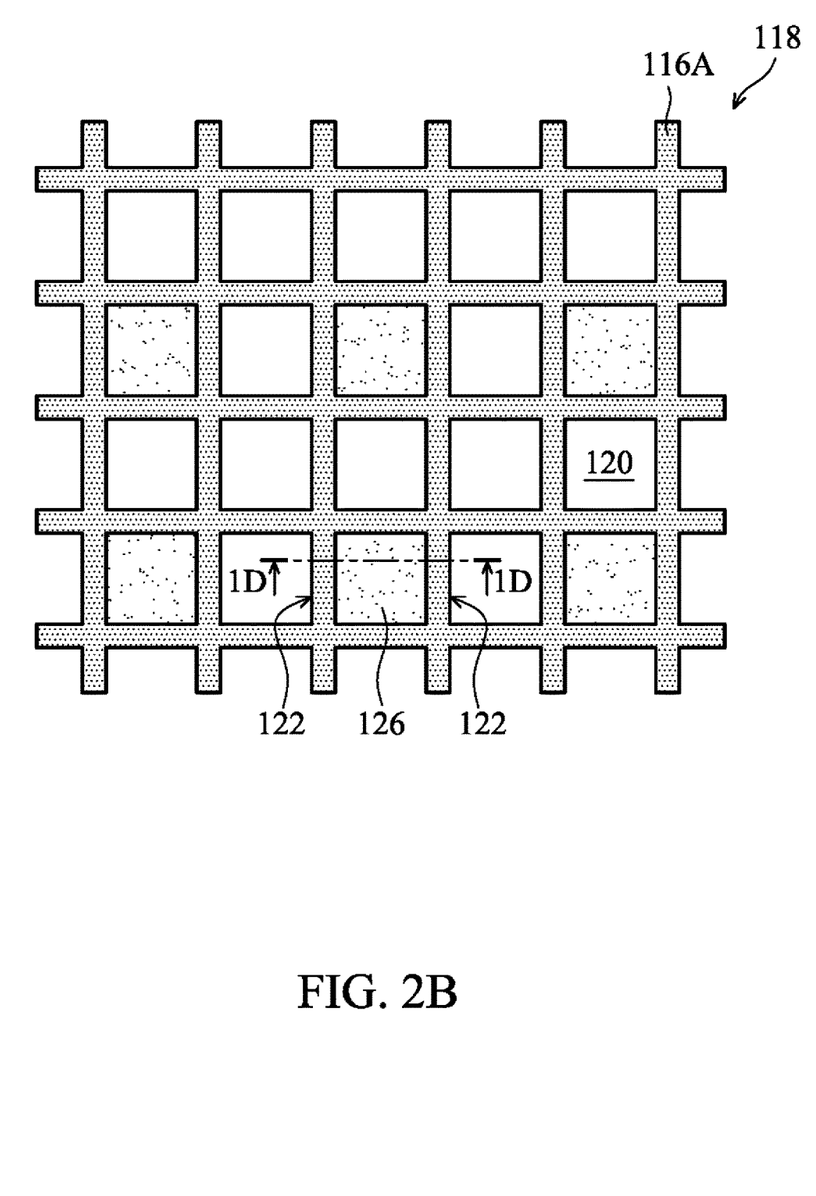

Afterwards, as shown in FIGS. 1B and 2A, the third dielectric material layer 116, the second dielectric material layer 114, the reflective material layer 112, the glue layer 110 and the first dielectric material layer 108 are partially etched to form a grid structure 118 over the semiconductor substrate 100, in accordance with some embodiments. It should be noted that FIG. 1B is a cross-sectional view along line 1B-1B in FIG. 2A in accordance with some embodiments.

As shown in FIGS. 1B and 2A, the etching process also forms a cavity 120 surrounded by the grid structure 118, in accordance with some embodiments. As shown in FIG. 1B, the first dielectric film 106 is exposed by the cavity 120, in accordance with some embodiments. As shown in FIG. 1B, the cavity 120 is aligned with the photodiode component 102 in the semiconductor substrate 100, in accordance with some embodiments.

As shown in FIG. 1B, a portion of the first dielectric material layer 108 positioned corresponding to the photodiode component 102 is etched and removed, in accordance with some embodiments. As shown in FIG. 1B, the remaining portion of the first dielectric material layer 108 forms a bottom dielectric element 108A over the semiconductor substrate 100. In some embodiments, the bottom dielectric element 108A is made of silicon nitride, silicon dioxide, silicon oxynitride, another suitable material, or a combination thereof. In some embodiments, the bottom dielectric element 108A is made of silicon nitride.

As shown in FIG. 1B, a portion of the glue layer 110 positioned corresponding to the photodiode component 102 is etched and removed, in accordance with some embodiments. As shown in FIG. 1B, the remaining portion of the glue layer 110 forms a glue element 110A over the bottom dielectric element 108A, in accordance with some embodiments. In some embodiments, the glue element 110A is made of titanium nitride.

As shown in FIG. 1B, a portion of the reflective material layer 112 positioned corresponding to the photodiode component 102 is etched and removed, in accordance with some embodiments. As shown in FIG. 1B, the remaining portion of the reflective material layer 112 forms a reflective element 112A over the glue element 110A and the bottom dielectric element 108A, in accordance with some embodiments. As shown in FIG. 1B, the reflective element 112A is positioned over the first dielectric film 106, in accordance with some embodiments. As shown in FIGS. 1B and 2A, the reflective element 112A surrounds the cavity 120, in accordance with some embodiments. As shown in FIGS. 1B and 2A, the reflective element 112A has a sidewall 122, in accordance with some embodiments.

In some embodiments, the reflective element 112A is made of titanium. In some embodiments, the reflective element 112A is made of an organic material which is anti-corrosive in a basic condition and an acidic condition. In some embodiments, when the reflective element 112A is made of titanium, the reflective element 112A is also referred to as a titanium-based grid element 112A or a titanium grid element 112A.

As shown in FIG. 1B, a portion of the second dielectric material layer 114 positioned corresponding to the photodiode component 102 is etched and removed, in accordance with some embodiments. As shown in FIG. 1B, the remaining portion of the second dielectric material layer 114 forms an upper dielectric element 114A over the reflective element 112A. In some embodiments, the upper dielectric element 114A is made of silicon dioxide, silicon nitride, silicon oxynitride, another suitable material, or a combination thereof. In some embodiments, the upper dielectric element 114A is made of silicon dioxide.

As shown in FIG. 1B, a portion of the third dielectric material layer 116 positioned corresponding to the photodiode component 102 is etched and removed, in accordance with some embodiments. As shown in FIG. 1B, the remaining portion of the third dielectric material layer 116 forms an additional dielectric element 116A over the upper dielectric element 114A. In some embodiments, the additional dielectric element 116A is made of silicon oxynitride, silicon dioxide, silicon nitride, another suitable material, or a combination thereof. In some embodiments, the additional dielectric element 116A is made of silicon oxynitride.

In some embodiments, the material of the additional dielectric element 116A is different from the material of the upper dielectric element 114A. In some other embodiments, the material of the additional dielectric element 116A is the same as the material of the upper dielectric element 114A.

As shown in FIG. 1B, the grid structure 118 includes the bottom dielectric element 108A over the semiconductor substrate 100, the glue element 110A over the bottom dielectric element 108A, the reflective element 112A over the glue element 110A, the upper dielectric element 114A over the reflective element 112A, and the additional dielectric element 116A over the upper dielectric element 114A, in accordance with some embodiments.

As shown in FIG. 1B, the glue element 110A is positioned between the bottom dielectric element 108A and the reflective element 112A, in accordance with some embodiments. As shown in FIGS. 1B and 2A, the cavity 120 is surrounded by the reflective element 112A of the grid structure 118, in accordance with some embodiments.

Figure 1C:
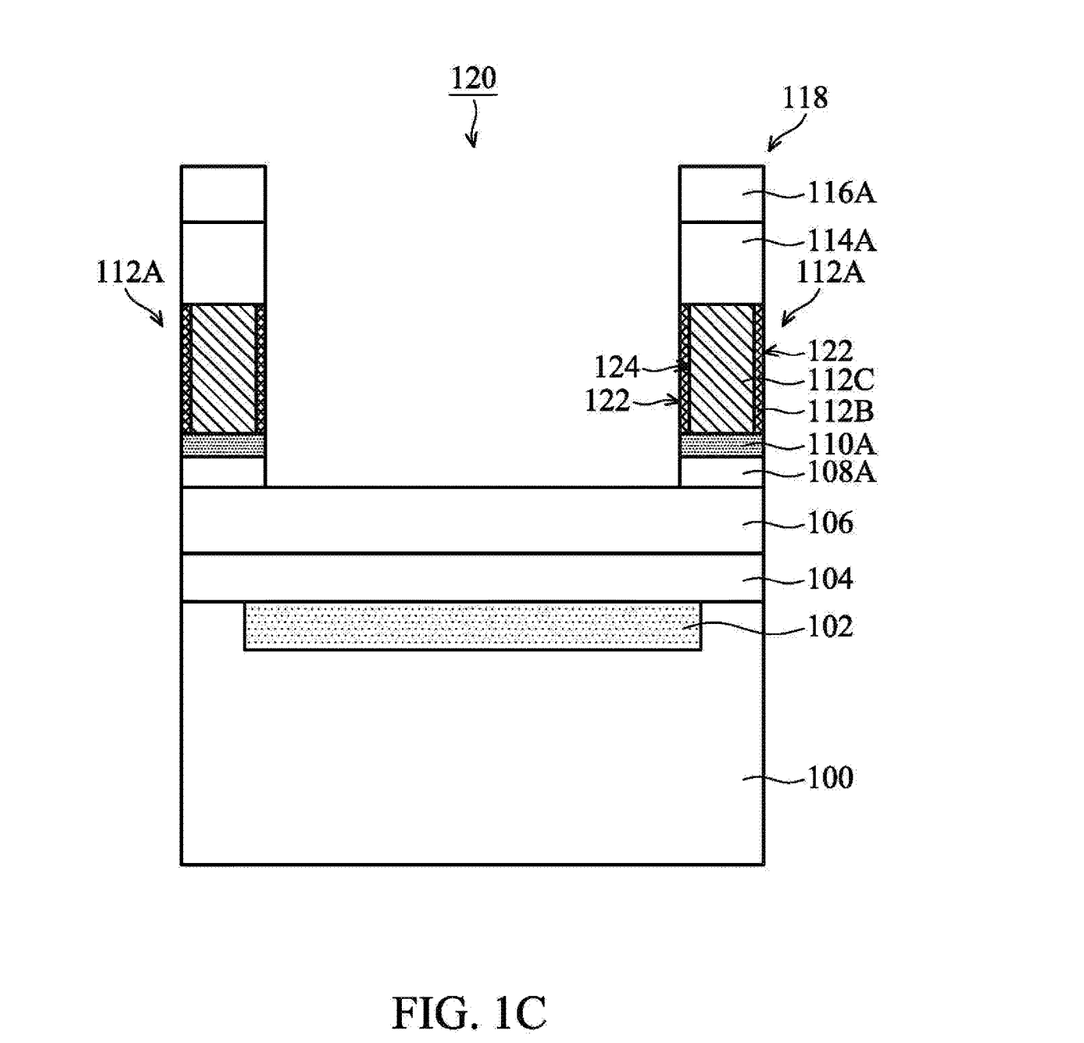

In some embodiments, the reflective element 112A is made of titanium, and the reflective element 112A is also referred to as a titanium-based grid element 112A. Afterwards, as shown in FIG. 1C, as the cavity 120 is formed, the sidewall 122 of the reflective element 112A is exposed to the cavity 120, in accordance with some embodiments. Thereby, as shown in FIG. 1C, a side portion of the reflective element 112A (also called a titanium-based grid element 112A) which is made of titanium is transferred into a titanium dioxide portion 112B. In some embodiments, the titanium dioxide portion 112B is also referred to as a titanium dioxide film 112B.

Specifically, in some embodiments, the sidewall 122 of the reflective element 112A is exposed to oxygen in the cavity 120 to transfer the side portion of the reflective element 112A which is made of titanium into the titanium dioxide portion 112B.

As shown in FIG. 1C, the portion of the titanium reflective element 112A which is not transferred into titanium dioxide is referred to as a titanium main portion 112C, in accordance with some embodiments. As shown in FIG. 1C, the titanium main portion 112C is positioned between the bottom dielectric element 108A and the upper dielectric element 114A, in accordance with some embodiments. As shown in FIG. 1C, the titanium main portion 112C is positioned between the glue element 110A and the upper dielectric element 114A, in accordance with some embodiments.

As shown in FIG. 1C, the titanium main portion 112C has a side surface 124, in accordance with some embodiments. As shown in FIG. 1C, the titanium dioxide portion 112B is positioned over the side surface 124 of the titanium main portion 112C, in accordance with some embodiments.

In other words, in some embodiments, the reflective element 112A is made of a titanium-based material. As shown in FIG. 1C, the reflective element 112A includes the titanium main portion 112C and the titanium dioxide portion 112B positioned over the side surface 124 of the titanium main portion 112C, in accordance with some embodiments.

As shown in FIG. 1C, the sidewall 122 of the reflective element 112A is a part of the titanium dioxide portion 112B and is made of titanium dioxide, and titanium dioxide is anti-corrosive in a basic condition and an acidic condition. Therefore, the sidewall 122 of the reflective element 112A is anti-corrosive in the basic condition and the acidic condition, in accordance with some embodiments.

In other words, as shown in FIG. 1C, the titanium dioxide portion 112B has a sidewall 122 which is anti-corrosive in the basic condition and the acidic condition, in accordance with some embodiments.

However, the embodiments of the present disclosure are not limited thereto. In some other embodiments, the reflective element 112A in FIG. 1B is made of organic material which is anti-corrosive in the basic condition and the acidic condition. Therefore, in these embodiments, the sidewall 122 of the reflective element 112A is made of the organic material and is anti-corrosive in the basic condition and the acidic condition. In these embodiments, the side portion of the reflective element 112A is not transferred to a material that is different from the material of the main portion.

It should be noted that although the following figures depicts the titanium dioxide portion 112B and the titanium main portion 112C of the reflective element 112A, the embodiments of the present disclosure are not limited thereto. In some other embodiments, the reflective element 112A does not include a side portion which is made of a material that is different from the material of the main portion.

In some embodiments, the sidewall 122 of the titanium dioxide portion 112B is anti-corrosive at a pH in a range from about −1 to about 20, or from about 1 to about 13, or from about 3 to about 11. In some embodiments, the basic condition refers to a condition with a pH in a range from about 7.5 to about 20, or from about 9 to about 13. In some embodiments, the acidic condition refers to a condition with a pH in a range from about 6.5 to about −1, or from about 5 to about 1.

The term "about" typically means +/−20% of the stated value, more typically +/−10% of the stated value, more typically +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about".

Figure 1D:
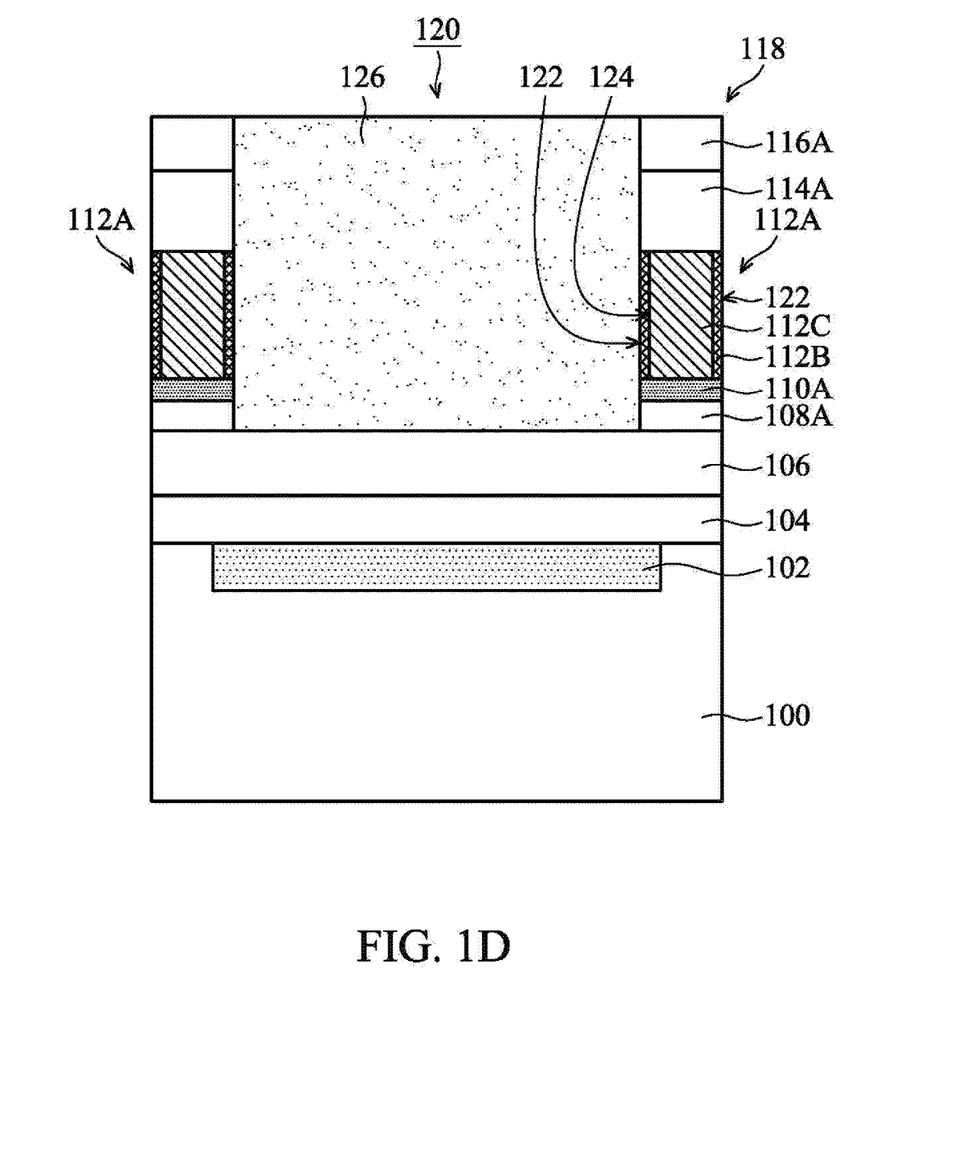

Afterwards, as shown in FIGS. 1D and 2B, a color filter element 126 is formed in one or more cavities 120 and surrounded by the reflective element 112A, in accordance with some embodiments. As shown in FIG. 1D, the color filter element 126 is surrounded by the grid structure 118, in accordance with some embodiments. It should be noted that FIG. 1D is a cross-sectional view along line 1D-1D in FIG. 2B in accordance with some embodiments.

As shown in FIG. 1D, the color filter element 126 is positioned over the semiconductor substrate 100, in accordance with some embodiments. As shown in FIG. 1D, the color filter element 126 is aligned with the photodiode component 102, in accordance with some embodiments. As shown in FIG. 1D, the sidewall 122 of the reflective element 112A contacts the color filter element 126, in accordance with some embodiments. As shown in FIG. 1D, the distance between the opposite sidewalls 122 of the reflective element 112A is substantially equal to the width of the color filter element 126 between the opposite sidewalls 122 of the reflective element 112A, in accordance with some embodiments.

As shown in FIG. 1D, the anti-reflection coating 104 and first dielectric film 106 are positioned under the color filter element 126 and the grid structure 118, in accordance with some embodiments.

In some embodiments, the color filter element 126 includes a blue color filter, green color filter, red color filter, a transparent layer, or another suitable element.

In some embodiments, a color filter material layer is deposited over the semiconductor substrate 100 and filled into the cavities 120 shown in FIG. 2A. Afterwards, in some embodiments, the color filter material layer is exposed by an exposure process. Afterwards, in some embodiments, the color filter material layer is developed using a developing solution to remove a portion of the color filter material layer. The remaining portions of the color filter material layer in one or more cavities 120 form the color filter elements 126 shown in FIG. 2B.

In some embodiments, in the developing process, the developing solution would contact the sidewall of the reflective element. In some embodiments, since the sidewall of the reflective element is anti-corrosive in the basic condition and the acidic condition, the present disclosure may protect the sidewall of the reflective element from damage caused by the developing solution. Therefore, the yield may be improved.

In addition, since the sidewall of the reflective element is anti-corrosive in the basic condition and the acidic condition, there is no need to form an additional dielectric film over the sidewall of the grid structure and over the first dielectric film to separate the sidewall of the reflective element from the developing solution. In some cases, the additional dielectric film is positioned between the grid structure and the color filter element and is a light leakage path. Therefore, in some embodiments, since there is no need to form an additional dielectric film between the grid structure and the color filter element, the light leakage path between the grid structure and the color filter element is eliminated. Therefore, the crosstalk issue may be reduced or prevented.

In addition, in some embodiments, the color filter element may contact the sidewall of the reflective element of the grid structure. In some embodiments, the color filter element fills the entire cavity surrounded by the grid structure. Therefore, the width of the color filter element may increase, which in turn increases the quantum yield of the image sensor structure. In some embodiments, the width of the color filter element increases by about 10%-15% compared to cases in which the additional dielectric film is formed.

Furthermore, since there is no need to form an additional dielectric film over the sidewall of the grid structure and over the first dielectric film, the color filter element is closer to the photodiode component compared to cases in which the additional dielectric film is formed. Therefore, the light path may be shortened, which in turn increases the quantum yield and light sensitivity of the image sensor structure.

Figure 3A:
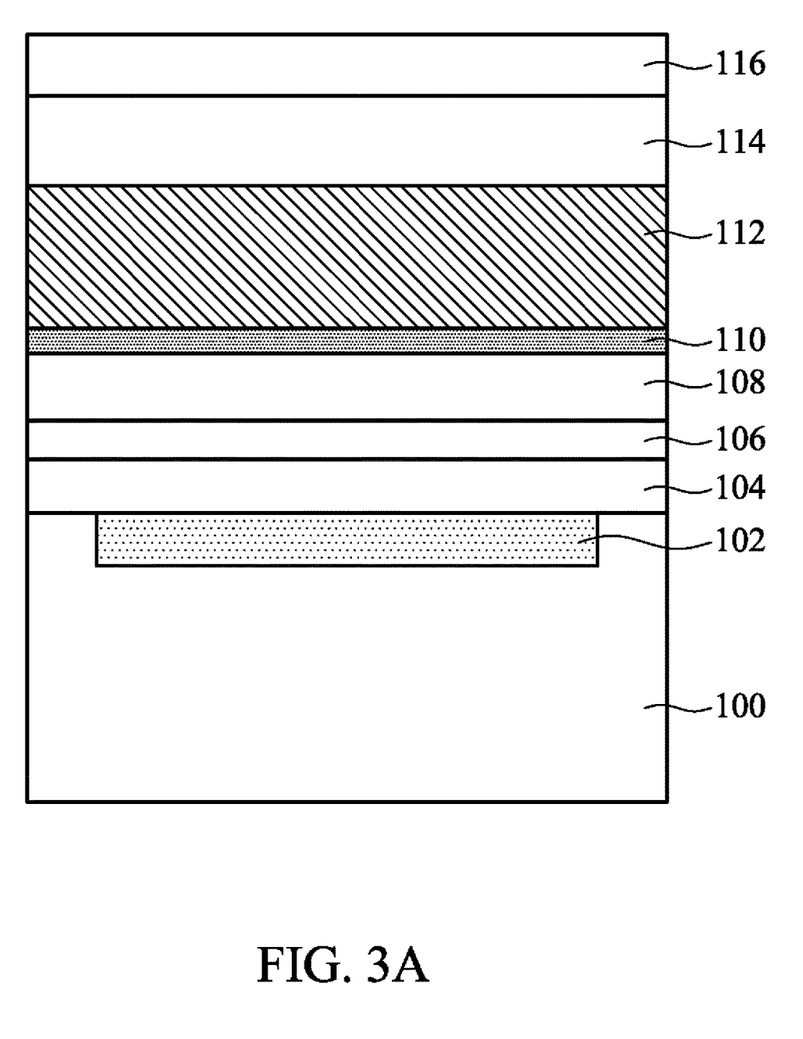
FIGS. 3A-3B are cross-sectional views of various stages of a process for forming an image sensor structure, in accordance with some embodiments.
Figure 3B:
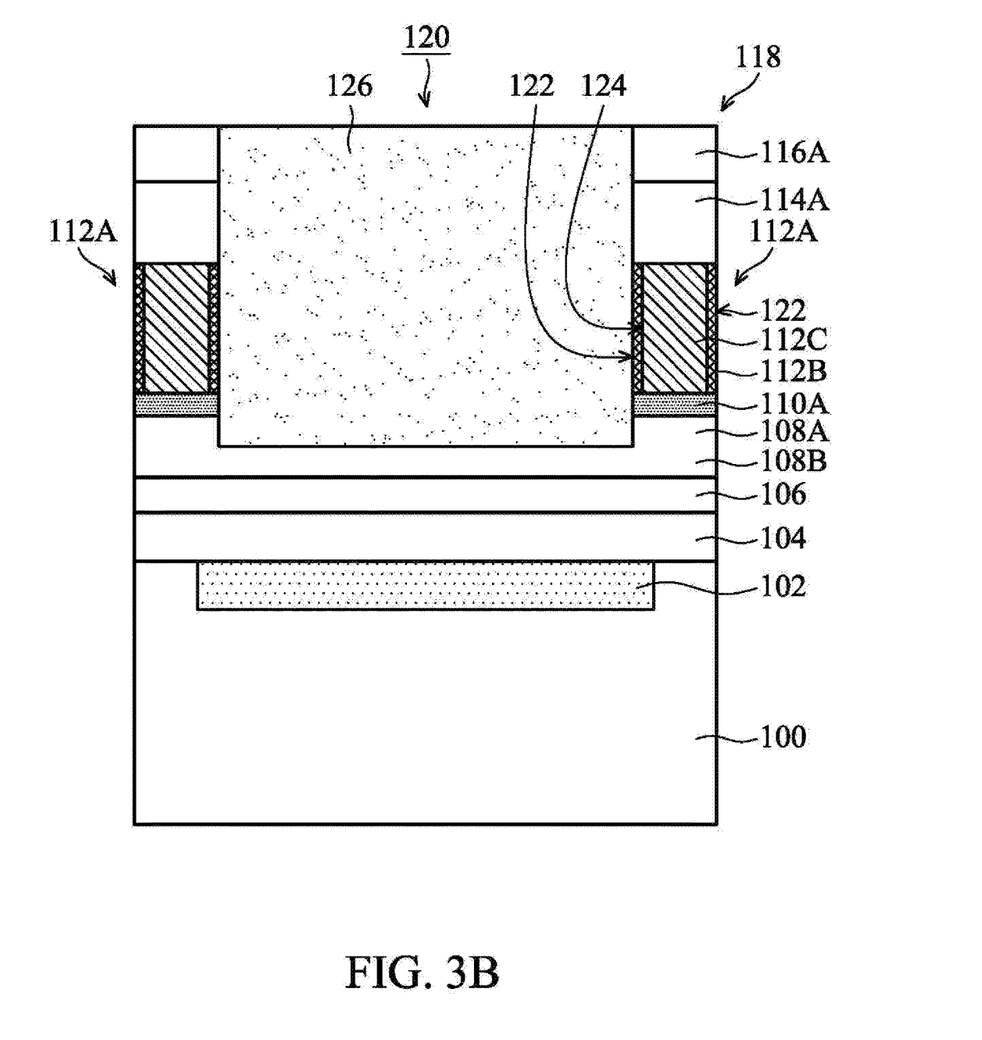

It should be noted that the exemplary embodiment set forth in FIGS. 1A-1D and 2A-2B is merely for the purpose of illustration. In addition to the embodiment set forth in FIGS. 1A-1D and 2A-2B, the image sensor structure could have other configuration as shown in FIGS. 3A-3B. This will be described in more detail in the following description. Therefore, the present disclosure is not limited to the exemplary embodiment shown in FIGS. 1A-1D and 2A-2B.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

FIG. 3A is a cross-sectional view of one stage of a process for forming an image sensor structure, in accordance with some embodiments. The difference between the embodiment shown in FIG. 3A and the embodiment shown in FIG. 1A is that the first dielectric material layer 108 is thicker than the first dielectric film 106. However, it should be noted that the embodiments of the present disclosure are not limited thereto.

Afterwards, as shown in FIG. 3B, the difference between the embodiment shown in FIG. 3B and the embodiment shown in FIGS. 1B-1D is that during the etching of the third dielectric material layer 116, the second dielectric material layer 114, the reflective material layer 112, the glue layer 110, the first dielectric material layer 108 is partially etched, in accordance with some embodiments. In other words, as shown in FIG. 3B, during the formation of the grid structure 118, the first dielectric material layer 108 is partially etched, in accordance with some embodiments.

As shown in FIG. 3B, an upper portion of the first dielectric material layer 108 positioned over the first dielectric film 106 and positioned corresponding to the photodiode component 102 is removed, in accordance with some embodiments. As shown in FIG. 3B, a lower portion of the first dielectric material layer 108 positioned over the first dielectric film 106 and positioned corresponding to the photodiode component 102 remains, in accordance with some embodiments.

As shown in FIG. 3B, the first dielectric material layer 108 is partially etched to form a second dielectric film 108B over the first dielectric film 106 and the photodiode component 102, in accordance with some embodiments. As shown in FIG. 3B, the second dielectric film 108B is positioned under the color filter element 126 and the grid structure 118, in accordance with some embodiments.

As shown in FIG. 3B, the partial etching of the first dielectric material layer 108 also forms the bottom dielectric element 108A over the second dielectric film 108B, in accordance with some embodiments. As shown in FIG. 3B, the bottom dielectric element 108A and the second dielectric film 108B are formed in one piece, in accordance with some embodiments. In some embodiments, the bottom dielectric element 108A and the second dielectric film 108B are made of silicon nitride.

As shown in FIG. 3B, the first dielectric film 106 is not exposed by the cavity 120 after the etching process which forms the grid structure 118, in accordance with some embodiments.

In some embodiments, the etching process which forms the grid structure 118 uses plasma radiation. In some embodiments, the second dielectric film 108B over the photodiode component 102 absorbs the energy of the plasma radiation. Therefore, in some embodiments, the second dielectric film 108B prevents the photodiode component 102 from being damaged by the plasma radiation. In some embodiments, the dark current issue and the white pixel issue are prevented.

Figure 4:
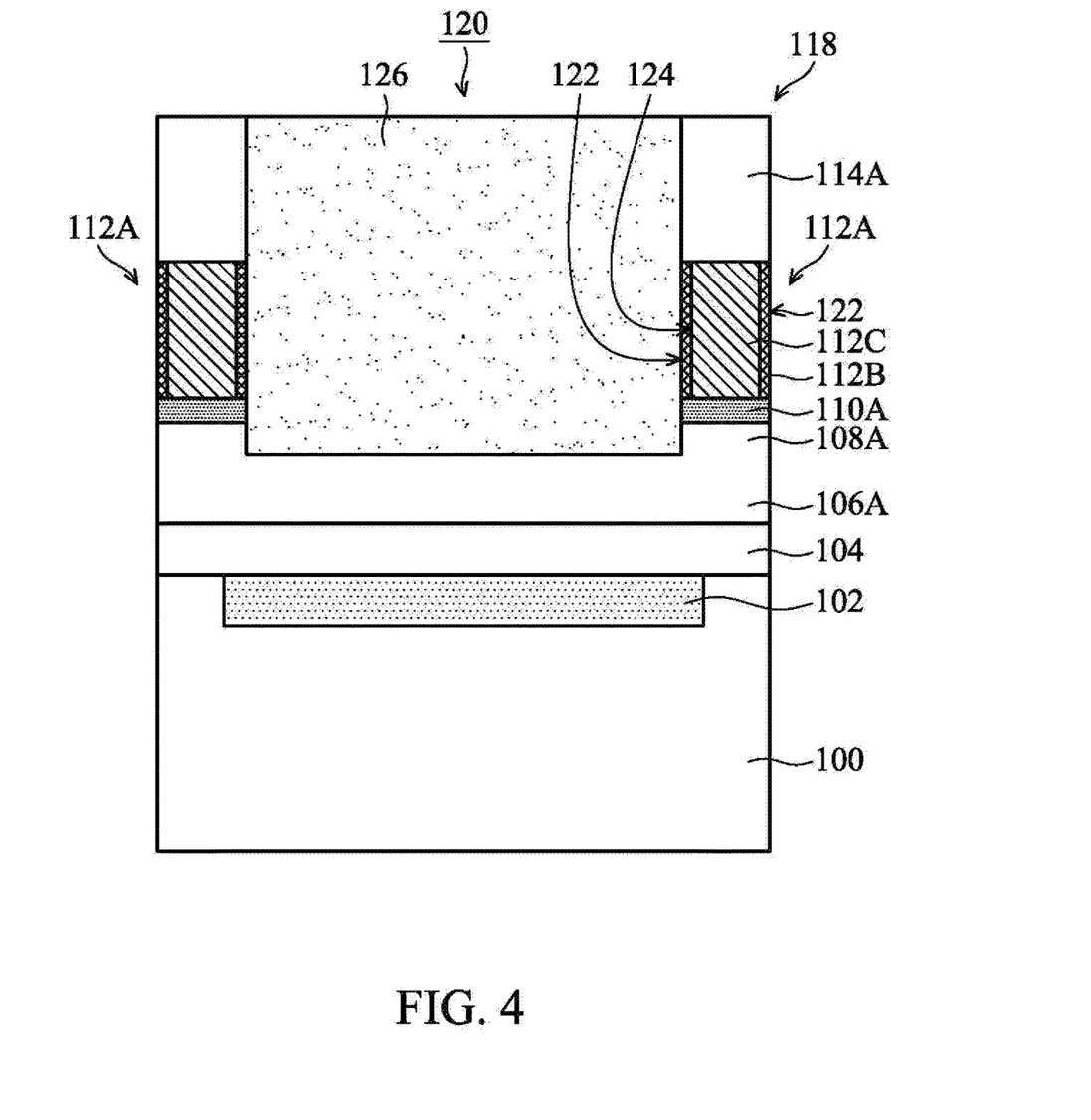
FIG. 4 is a cross-sectional view of an image sensor structure in accordance with some embodiments.

It should be noted that the exemplary embodiments set forth in FIGS. 1A-3B are merely for the purpose of illustration. In addition to the embodiments set forth in FIGS. 1A-3B, the image sensor structure could have other configuration as shown in FIG. 4. This will be described in more detail in the following description. Therefore, the present disclosure is not limited to the exemplary embodiments shown in FIGS. 1A-3B.

Note that the same or similar elements or layers corresponding to those of the semiconductor device are denoted by like reference numerals. In some embodiments, the same or similar elements or layers denoted by like reference numerals have the same meaning and will not be repeated for the sake of brevity.

FIG. 4 is a cross-sectional view of one stage of a process for forming an image sensor structure, in accordance with some embodiments. The difference between the embodiment shown in FIG. 4 and the embodiment shown in FIG. 1D is that the additional dielectric element 116A is not formed. In addition, as shown in FIG. 4, the first dielectric material layer 108 is not formed.

As shown in FIG. 4, during the etching of the second dielectric material layer 114, the reflective material layer 112, the glue layer 110, the first dielectric film 106 is partially etched, in accordance with some embodiments. In other words, as shown in FIG. 4, during the formation of the grid structure 118, the first dielectric film 106 is partially etched, in accordance with some embodiments.

As shown in FIG. 4, an upper portion of the first dielectric film 106 positioned over the anti-reflection coating 104 and positioned corresponding to the photodiode component 102 is removed, in accordance with some embodiments. As shown in FIG. 4, a lower portion of the first dielectric film 106 positioned over the anti-reflection coating 104 and positioned corresponding to the photodiode component 102 remains, in accordance with some embodiments.

As shown in FIG. 4, the first dielectric film 106 is partially etched to form a dielectric film 106A over the anti-reflection coating 104 and the photodiode component 102, in accordance with some embodiments. As shown in FIG. 4, the dielectric film 106A is positioned under the color filter element 126 and the grid structure 118, in accordance with some embodiments.

As shown in FIG. 4, the partial etching of the first dielectric film 106 also forms the bottom dielectric element 108A over the dielectric film 106A, in accordance with some embodiments. As shown in FIG. 4, the bottom dielectric element 108A and the dielectric film 106A are formed in one piece, in accordance with some embodiments. In some embodiments, the bottom dielectric element 108A and the dielectric film 106A are made of silicon dioxide. In some embodiments, the upper dielectric element 114A is also made of silicon dioxide. In some other embodiments, the glue layer 110 and the glue element 110A are not formed.

Embodiments of the disclosure use the reflective element having a sidewall which is anti-corrosive in the basic condition and the acidic condition. Therefore, embodiments of the disclosure may protect the sidewall of the reflective element from damage caused by the developing solution. Therefore, the yield may be improved.

In addition, since the sidewall of the reflective element is anti-corrosive in the basic condition and the acidic condition, there is no need to form an additional dielectric film over the sidewall of the grid structure and over the first dielectric film to separate the sidewall of the reflective element from the developing solution. In some cases, the additional dielectric film is positioned between the grid structure and the color filter element and is a light leakage path. Therefore, in some embodiments, since there is no need to form an additional dielectric film between the grid structure and the color filter element, the light leakage path between the grid structure and the color filter element is eliminated. Therefore, the crosstalk issue may be reduced or prevented.

In addition, in some embodiments, the color filter element may contact the sidewall of the reflective element of the grid structure. In some embodiments, the color filter element fills the entire cavity surrounded by the grid structure. Therefore, the width of the color filter element may increase, which in turn increases the quantum yield of the image sensor structure. In some embodiments, the width of the color filter element increases by about 10%-15% compared to cases in which the additional dielectric film is formed.

Furthermore, since there is no need to form an additional dielectric film over the sidewall of the grid structure and over the first dielectric film, the color filter element is closer to the photodiode component compared to cases in which the additional dielectric film is formed. Therefore, the light path may be shortened, which in turn increases the quantum yield and light sensitivity of the image sensor structure.

In accordance with some embodiments, an image sensor structure is provided. The image sensor structure includes a substrate, a photodiode component in the substrate, and a grid structure over the substrate. The grid structure includes a bottom dielectric element over the substrate, a reflective element over the bottom dielectric element, and an upper dielectric element over the reflective element. The reflective element has a sidewall which is anti-corrosive in a basic condition and an acidic condition. The image sensor structure also includes a color filter element over the substrate and surrounded by the grid structure. The color filter element is aligned with the photodiode component.

In accordance with some embodiments, an image sensor structure is provided. The image sensor structure includes a substrate, a photodiode component in the substrate, and a grid structure over the substrate. The grid structure includes a bottom dielectric element over the substrate, a reflective element over the bottom dielectric element and having a sidewall, and an upper dielectric element over the reflective element. The image sensor structure also includes a color filter element over the substrate and surrounded by the grid structure. The color filter element is aligned with the photodiode component. The sidewall of the reflective element contacts the color filter element.

In accordance with some embodiments, a method for forming an image sensor structure is provided. The method includes providing a substrate, forming a photodiode component in the substrate, forming an anti-reflection coating over the substrate, forming a first dielectric film over the anti-reflection coating, and forming a titanium-based layer over the first dielectric film. The method also includes partially etching the titanium-based layer to form a titanium-based grid element over the first dielectric film and to form a cavity surrounded by the titanium-based grid element. The titanium-based grid element has a sidewall. The method further includes exposing the sidewall of the titanium-based grid element to the cavity to transfer a side portion of the titanium-based grid element into a titanium dioxide portion, and forming a color filter element in the cavity and surrounded by the titanium-based grid element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor structure, comprising:
   a substrate;
   a photodiode component in the substrate;
   a grid structure over the substrate, wherein the grid structure comprises a titanium main portion and a titanium dioxide film, the titanium dioxide film is disposed over a side surface of the titanium main portion; and
   a color filter element over the substrate and surrounded by the grid structure,
   wherein the color filter element is aligned with the photodiode component,
   wherein the grid structure further comprises a bottom dielectric element and an upper dielectric element, and
   wherein the titanium main portion and the titanium dioxide film is disposed between the bottom dielectric element and the upper dielectric element, and the titanium dioxide film is in direct contact with the color filter element.

2. The semiconductor memory structure as claimed in claim 1, further comprising:
   a first dielectric film over the substrate and under the color filter element and the grid structure, wherein a material of the first dielectric film is different from that of the bottom dielectric element.

3. The semiconductor memory structure as claimed in claim 2, further comprising:
   a second dielectric film over the first dielectric film and under the color filter element and the grid structure, wherein the second dielectric film and the bottom dielectric element are made of silicon nitride.

4. The semiconductor memory structure as claimed in claim 1, further comprising:
   a dielectric film over the substrate and under the color filter element and the grid structure, wherein the dielectric film and the bottom dielectric element are made of silicon dioxide.

5. An image sensor structure, comprising:
   a substrate;
   a photodiode component in the substrate;
   a grid structure over the substrate, wherein the grid structure comprises:
     a bottom dielectric element over the substrate;
     a reflective element over the bottom dielectric element and having a sidewall; and
     an upper dielectric element over the reflective element; and
   a color filter element over the substrate and surrounded by the grid structure,
   wherein the color filter element is aligned with the photodiode component,
   wherein the sidewall of the reflective element contacts the color filter element, and
   wherein the reflective element comprises:
     a titanium main portion between the bottom dielectric element and the upper dielectric element, wherein the titanium main portion has a side surface; and
     a titanium dioxide film over the side surface of the titanium main portion, wherein the titanium dioxide film has the sidewall which is anti-corrosive in the basic condition and the acidic condition.

6. The image sensor structure as claimed in claim 5, wherein the grid structure further comprises:
   an additional dielectric element over the upper dielectric element, wherein a material of the additional dielectric element is different from that of the upper dielectric element.

7. The image sensor structure as claimed in claim 5, wherein the grid structure further comprises:
   a glue element between the bottom dielectric element and the reflective element.

8. The image sensor structure as claimed in claim 5, further comprising:
   an anti-reflection coating over the substrate and under the color filter element and the grid structure.

9. The image sensor structure as claimed in claim 8, further comprising:
   a first dielectric film over the anti-reflection coating and under the color filter element and the grid structure.

10. An image sensor structure, comprising:
a substrate;
a photodiode component in the substrate;
a grid structure over the substrate, wherein the grid structure comprises:
   a bottom dielectric element over the substrate;
   a reflective element over the bottom dielectric element, wherein the reflective element has a sidewall which is anti-corrosive in a basic condition and an acidic condition; and
   an upper dielectric element over the reflective element; and
a color filter element over the substrate and surrounded by the grid structure,
wherein the color filter element is aligned with the photodiode component, and a bottom surface of the color filter element is lower than a top surface of the grid structure, and
wherein the reflective element comprises:
   a titanium main portion between the bottom dielectric element and the upper dielectric element, wherein the titanium main portion has a side surface; and
   a titanium dioxide film over the side surface of the titanium main portion, wherein the titanium dioxide film has the sidewall which is anti-corrosive in the basic condition and the acidic condition.

11. The image sensor structure as claimed in claim 10, wherein the sidewall of the titanium dioxide film is anti-corrosive at a pH in a range from about −1 to about 20.

12. The image sensor structure as claimed in claim 1, wherein the reflective element is made of a titanium-based material.

13. The image sensor structure as claimed in claim 1, wherein the reflective element is made of an organic material.

14. The image sensor structure as claimed in claim 10, wherein the grid structure further comprises:
   a glue element between the bottom dielectric element and the reflective element.

15. The image sensor structure as claimed in claim 14, wherein the grid structure further comprises:
   an additional dielectric element over the upper dielectric element, wherein a material of the additional dielectric element is different from that of the upper dielectric element.

16. The image sensor structure as claimed in claim 10, further comprising:
   an anti-reflection coating over the substrate and under the color filter element and the grid structure.

17. The image sensor structure as claimed in claim 16, further comprising:
   a first dielectric film over the anti-reflection coating and under the color filter element and the grid structure.

18. The image sensor structure as claimed in claim 17, further comprising:
   a second dielectric film over the first dielectric film and under the color filter element and the grid structure, wherein the second dielectric film is made of silicon nitride.

* * * * *